(12) United States Patent
Inomata

(10) Patent No.: US 12,282,056 B2
(45) Date of Patent: Apr. 22, 2025

(54) SEMICONDUCTOR DEVICE

(71) Applicant: RENESAS ELECTRONICS CORPORATION, Tokyo (JP)

(72) Inventor: Noboru Inomata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 146 days.

(21) Appl. No.: 18/347,137

(22) Filed: Jul. 5, 2023

(65) Prior Publication Data

US 2024/0094279 A1 Mar. 21, 2024

(30) Foreign Application Priority Data

Sep. 16, 2022 (JP) ................................ 2022-148235

(51) Int. Cl.
*G01R 31/28* (2006.01)

(52) U.S. Cl.
CPC ..... *G01R 31/2853* (2013.01); *G01R 31/2884* (2013.01)

(58) Field of Classification Search
CPC ............ G01R 31/2853; G01R 31/2884; G01R 31/2896
USPC ...................................... 324/750.3, 537, 500
See application file for complete search history.

(56) References Cited

U.S. PATENT DOCUMENTS

| 6,687,140 B2 | 2/2004 | Kitamura | |
| 9,588,174 B1* | 3/2017 | Robertazzi | ......... G01R 31/3004 |
| 2021/0341535 A1* | 11/2021 | Hsieh | .................. G01R 31/2884 |
| 2024/0310439 A1* | 9/2024 | Kim | ................. G01R 31/31905 |

FOREIGN PATENT DOCUMENTS

JP 2003-240810 A 8/2003

* cited by examiner

*Primary Examiner* — Giovanni Astacio-Oquendo
(74) *Attorney, Agent, or Firm* — Rimon P.C.

(57) ABSTRACT

A disconnection detector circuit that can favorably inspect a connection state of a wire without increase in parasitic capacitance is provided. A semiconductor device includes, in one package, a first integrated circuit including a transformer including a primary coil and a secondary coil, and a second integrated circuit connected to a midpoint and one end of the secondary coil. The second integrated circuit includes a reference line and a detector circuit. The reference line connects the midpoint of the secondary coil and a reference potential. On basis of a potential at a predetermined reference point of the first power supply line, the detector circuit detects whether a connection state between the second integrated circuit and the secondary coil is normal or abnormal.

10 Claims, 5 Drawing Sheets

SEMICONDUCTOR DEVICE

CROSS-REFERENCE TO RELATED APPLICATION

The disclosure of Japanese Patent Application No. 2022-148235 filed on Sep. 16, 2022, including the specification, drawings and abstract is incorporated herein by reference in its entirety.

BACKGROUND

The present invention relates to a semiconductor device.

In an integrated circuit, there is a circuit that detects disconnection of wire bonding.

There is disclosed a technique listed below.
[Patent Document 1] Japanese Unexamined Patent Application Publication No. 2003-240810

For example, the Patent Document 1 discloses a disconnection detector circuit including a switch that sets a detection signal to be supplied to a signal line and a resistance that supplies the detection signal set by the switch to the signal line. This disconnection detector circuit includes a control means that controls the switch to set the detection signal to be supplied to the signal line and determines whether the signal line has been disconnected or not on the basis of a change in the detection signal.

SUMMARY

Incidentally, there are semiconductor devices each having a configuration in which a plurality of semiconductor chips are connected by bonding wires in a package. In a case of the semiconductor device having such a configuration, it may be difficult to check the connection state of the bonding wire after the assembly is completed. Further, for example, in order to detect the connection state around the bonding with good sensitivity by the above-described technique, the current passing through the detector circuit is increased. However, when a circuit through which a large current can be passed is configured, parasitic capacitance is increased, and the circuit does not conform to the originally required circuit specifications.

A semiconductor device according to an embodiment of the present disclosure is a semiconductor device including, in one package, a first integrated circuit that includes a transformer including a primary coil and a secondary coil, and a second integrated circuit connected to a midpoint and one end of the secondary coil. The second integrated circuit includes a reference line and a detector circuit. The reference line connects the midpoint of the secondary coil and a reference potential. On basis of a potential at a predetermined reference point of the first power supply line, the detector circuit detects whether a connection state between the second integrated circuit and the secondary coil is normal or abnormal.

The present disclosure can favorably provide a disconnection detector circuit capable of inspecting the connection state of the wire without increasing the parasitic capacitance.

BRIEF DESCRIPTIONS OF THE DRAWINGS

DETAILED DESCRIPTION

Figure 1:
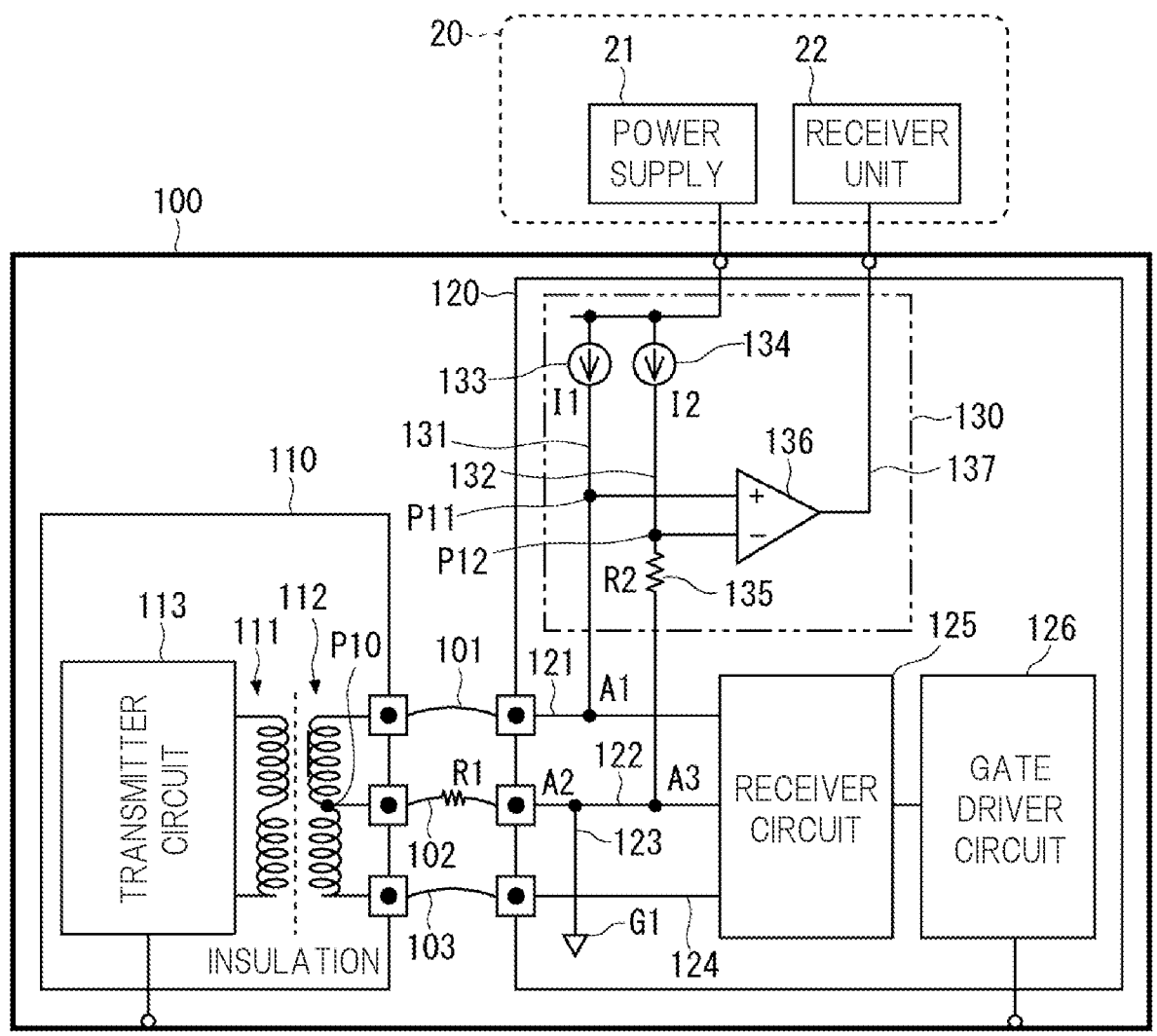
FIG. 1 is a diagram showing a configuration of a semiconductor device according to a first embodiment.

Hereinafter, the present invention will be described through embodiments of the invention. However, the invention according to the claims is not limited to the following embodiments. Further, not all the configurations described in the embodiments are essential as means for solving the problem. For clarity of description, the following description and drawings may be appropriately omitted or simplified. In each drawing, the same elements are denoted by the same reference characters, and a repetitive description is omitted as necessary.

First Embodiment

A first embodiment of the present disclosure will be described below with reference to the drawings. FIG. 1 is a diagram showing a configuration of a semiconductor device 100 according to the first embodiment. FIG. 1 shows a state where the semiconductor device 100 and an inspection system 20 are connected and inspect an internal circuit of the semiconductor device 100.

The inspection system 20 inspects a connection state in a predetermined circuit in the semiconductor device 100. More specifically, for example, the inspection system 20 inspects the connection state between a first integrated circuit 110 and a second integrated circuit 120 in the semiconductor device 100. The inspection system 20 includes, as a main configuration, an external power supply 21 and a receiver unit 22.

The external power supply 21 supplies a current to the second integrated circuit 120 of the semiconductor device 100. The receiver unit 22 is connected to an output line 137 of a detector circuit 130 of the semiconductor device 100, and receives a disconnection detection signal output by the detector circuit 130.

In addition to the above-described configuration, the inspection system 20 may include, for example, a circuit, a display device, etc. for outputting a result of inspection in accordance with a signal received by the receiver unit 22. The inspection system 20 may have a configuration for performing an inspection different from the above-described inspection. For example, the inspection system 20 may have a configuration or the like that performs an inspection not for the above-described matter related to a transformer included in the semiconductor device 100.

The semiconductor device 100 is a gate driver having an insulating function. The semiconductor device 100 is a semiconductor device including, in one package, a first integrated circuit 110 including an isolation transformer including a primary coil 111 and a secondary coil 112, and a second integrated circuit connected to the secondary coil 112. That is, the semiconductor device 100 includes, as a main configuration, the first integrated circuit 110 and the second integrated circuit 120. The first integrated circuit 110 and the second integrated circuit 120 are connected by wire bonding via a first wire 101, a second wire 102, and a third wire 103 in the package of the semiconductor device 100.

The first wire 101 connects one end of the secondary coil 112 and a first signal line 121 of the second integrated circuit 120. The second wire 102 connects a branch line connected to the midpoint P10 of the secondary coil 112 and a second signal line 122 of the second integrated circuit 120. The third wire 103 connects the other end of the secondary coil 112 and a third signal line 124 of the second integrated circuit 120.

The first integrated circuit 110 includes a transmitter circuit 113 connected to the primary coil 111 and a secondary coil 112 constituting a transformer (isolation transformer) adjacent to the primary coil 111. The transmitter circuit 113 receives a signal from the outside of the semiconductor device 100, and supplies a transmission signal based on the received signal to the primary coil 111. One end of the secondary coil 112 is connected to the first wire 101, the other end of the secondary coil 112 is connected to the third wire 103, and the midpoint P10 of the secondary coil 112 is connected to the second wire 102.

The second integrated circuit 120 is connected to the first integrated circuit 110 via the first wire 101, the second wire 102, and the third wire 103. The second integrated circuit 120 generates a drive signal for driving, for example, an IGBT (insulated gate bipolar transistor) from a signal received from the first integrated circuit 110, and outputs the drive signal. The second integrated circuit 120 includes, as a main configuration, the first signal line 121, the second signal line 122, a reference line 123, the third signal line 124, a receiver circuit 125, a gate driver circuit 126, and the detector circuit 130.

The first signal line 121 connects the first wire 101 and the receiver circuit 125. The first signal line 121 has a contact A1 connected to a first power supply line 131 of the detector circuit 130. The second signal line 122 connects the second wire 102 and the receiver circuit 125. The second signal line 122 has a contact A2 connected to the reference line 123 and a contact A3 connected to a second power supply line 132 of the detector circuit 130. The third signal line 124 connects the third wire 103 and the receiver circuit 125. One end of the reference line 123 is connected to the second signal line 122 at the contact A2, and the other end of the reference line 123 is connected to a reference potential unit G1. The reference potential unit G1 is set to a reference potential. The potential of the reference potential unit G1 is, for example, 0 V. Alternatively, the reference potential unit G1 can be at the ground.

The receiver circuit 125 performs predetermined processing on a signal received from the secondary coil 112, and supplies the processed signal to the gate driver circuit 126. At this time, while taking the potential of the second wire 102 as a reference potential, the receiver circuit 125 handles signals supplied from the first wire 101 and the third wire 103 as a differential signal. In the manner, the semiconductor device 100 can favorably process the transmission signal. The gate driver circuit 126 is configured to be capable of outputting a predetermined drive signal to the outside of the semiconductor device 100 on the basis of a processed signal received from the receiver circuit 125.

The detector circuit 130 detects that the connection state of the wire connected from the first power supply line 131 to the reference line 123 via the secondary coil 112 is normal or abnormal. The detector circuit 130 includes, as a main configuration, the first power supply line 131, the second power supply line 132, a first constant current supply 133, a second constant current supply 134, a reference resistance 135, a comparator 136, and the output line 137.

The first power supply line 131 receives supply of a preset current from the first constant current supply 133, and supplies this current to the first wire 101 via the contact A1 and the first signal line 121. The first power supply line 131 has a reference point P11. A branch line extends from the reference point P11, and a first input signal is supplied to the comparator 136 via this branch line.

One end of the second power supply line 132 receives supply of a preset current from the second constant current supply 134, and the other end that is the contact A3 is connected to the second signal line 122 via the reference resistance 135. The contact A3 is connected to the reference potential unit G1 via the second signal line 122 and the reference line 123. Therefore, the potential of the second signal line 122 at the contact A3 is the reference potential.

The second power supply line 132 is connected to the reference potential unit G1 via the second signal line 122 and the reference line 123. However, a configuration of the second power supply line 132, the configuration being opposite to the connection side with the second constant current supply 134, is not limited to the above-described configuration as long as the potential is the reference potential.

In the second power supply line 132, the reference resistance 135 interposes between the second constant current supply 134 and the contact A3. The second power supply line 132 has a reference point P12 between the second constant current supply 134 and the reference resistance 135. A branch line extends from the reference point P12, and a second input signal is supplied to the comparator 136 via this branch line.

The first constant current supply 133 is a circuit that receives a current supplied from the external power supply 21 provided outside the semiconductor device 100 and supplies a constant current to the first power supply line 131. The second constant current supply 134 is a circuit that receives a current supplied from the external power supply 21 provided outside the semiconductor device 100 and supplies a constant current to the second power supply line 132.

The comparator 136 receives inputs from the branch line of the first power supply line 131 branched at the reference point P11 and the branch line of the second power supply line 132 branched at the reference point P12, and compares the potential of the reference point P11 which is the first input signal and the potential of the reference point P12 which is the second input signal. For example, the comparator 136 outputs an L level when the potential of the reference point P11 is lower than the potential of the reference point P12. Further, the comparator 136 outputs an H level when the potential of the reference point P11 is equal to or higher than the potential of the reference point P12. The output line 137 is a signal line for outputting an output signal of the comparator 136 to the outside. The output line 137 is connected to the receiver unit 22 of the inspection system 20.

In the above-described configuration, the detector circuit 130 has the following function. In a state where the inspection system 20 and the semiconductor device 100 are connected, the first constant current supply 133 supplies a constant current to the first power supply line 131. Then, a predetermined voltage is generated in the wire connected from the first power supply line 131 to the reference line 123. Here, an end of the secondary coil 112 and the first signal line 121 are connected via a bonding wire, and the midpoint P10 and the second signal line 122 are connected via a bonding wire.

If the connection state between the second wire 102 and the wire bonding connecting the second wire 102 is a disconnection state, the resistance value of this portion is relatively high. The potential of the reference point P11 in such a case of a disconnection state is a value higher than the potential of the reference point P11 in the case of a non-disconnection state. Thus, on the basis of the potential of the reference point P11 of the first power supply line 131, the detector circuit 130 detects that the connection state of the wire connected from the first power supply line 131 to the reference line 123 via the secondary coil 112 is normal or abnormal.

In the following description, expressions such as "connection state", "disconnection", and "disconnection state" refer to the conduction state of the second wire 102 and the wire bonding connecting the second wire 102. Further, "the normal connection state" means that the above-described conduction state is good, and "the abnormal connection state" means that the above-described conduction state is not good.

The detector circuit 130 will be further described together with a specific example below. The first constant current supply 133 supplies a current I1 to the first power supply line 131. The second constant current supply 134 supplies a current I2 to the second power supply line 132. The resistance value of the second wire 102 is denoted by R1. In this case, when the potential of the reference point P11 is denoted by V11, V11 is expressed as "R1*I1". Similarly, when the resistance value of the reference resistance 135 of the second power supply line 132 is denoted by R2, the potential V12 of the reference point P12 is expressed as "R2*I2". When the second wire 102 is not disconnected, the resistance value R1 is sufficiently low. That is, this case shows "R1<R2*I2/I1", and V11 is smaller than V12. Thus, the comparator 136 outputs the L level.

On the other hand, when the second wire 102 is disconnected, the resistance value R1 is high. This case shows, for example, "R1≥R2*I2/I1", and V11 is equal to or higher than V12. Then, the comparator 136 outputs the H level.

Thus, the detector circuit 130 compares the potential difference between the potential V11 at the reference point P11 and the potential V12 at the reference point P12 which is a predetermined position in the second power supply line 132. In the manner, the detector circuit 130 outputs the L level when the connection state is normal, and outputs the H level when the connection state is abnormal. The output line 137 outputs the output of the comparator 136 to the outside, and transmits the output to the receiver unit 22.

As described above, the semiconductor device 100 detects disconnection of the second wire 102 by comparing the voltage of the reference point P11 and the voltage of the reference point P12. At this time, the threshold for detecting disconnection of the second wire 102 can be set by adjusting the voltage V12 at the reference point P12. The sensitivity of disconnection detection is made relatively high by setting, for example, the voltage V12 to a relatively small value. Thus, the semiconductor device 100 does not need to increase the amount of current for the increase in the detection sensitivity. Therefore, in the semiconductor device 100, the detection sensitivity can be increased without the increase in the parasitic capacitance of the circuit related to the disconnection detection.

The disconnection of the second wire 102 is detected as described above preferably after it is checked that neither the first wire 101 nor the third wire 103 is disconnected. Disconnection of the first wire 101 and disconnection of the third wire 103 can be inspected by an ordinary function inspection of the semiconductor device 100. The ordinary function inspection mentioned here is matter that can be conceived by a person skilled in the art in this field. Thus, its detailed description is omitted here. On the other hand, when the second wire 102 is disconnected, a function inspection in a low-noise environment such as the ordinary inspection environment does not change so that abnormality in characteristics is revealed. Since the semiconductor device 100 includes the detector circuit 130, the semiconductor device 100 can detect the disconnection of the second wire 102 in the above-described inspection. When the above-described inspection ends, the semiconductor device 100 is disconnected from the inspection system 20.

Figure 2:
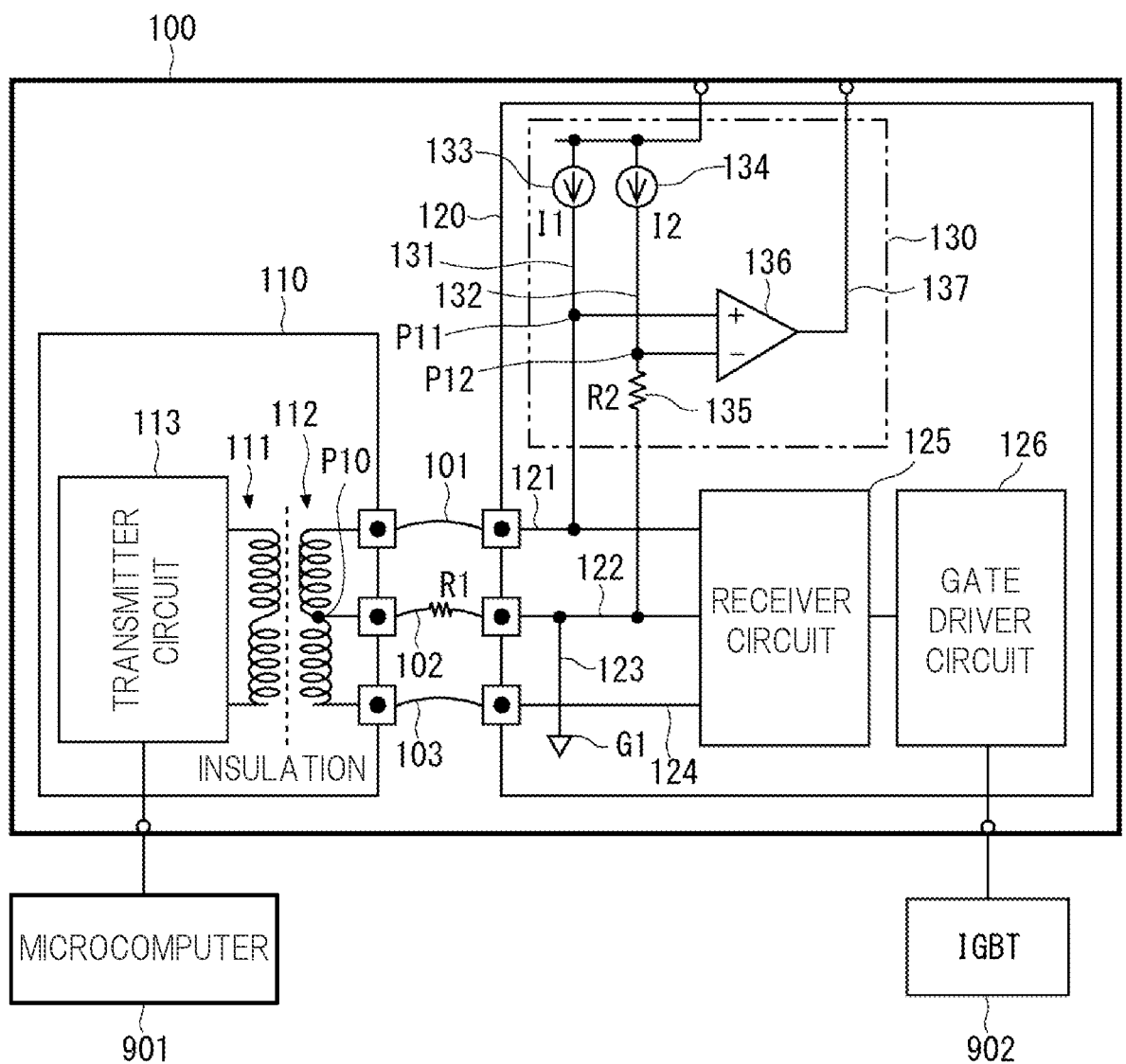
FIG. 2 is a diagram showing a use example of the semiconductor device according to the first embodiment.

Next, a use state of the semiconductor device 100 will be described with reference to FIG. 2. FIG. 2 is a diagram showing a use example of the semiconductor device according to the first embodiment.

The semiconductor device 100 is a gate driver having an insulating function. The first integrated circuit 110 of the semiconductor device 100 is connected to a microcomputer 901, and receives a predetermined control signal from the microcomputer 901. To the primary coil 111, the transmitter circuit 113 of the first integrated circuit 110 supplies a predetermined transmission signal based on the control signal received from the microcomputer 901. The primary coil 111 and the secondary coil 112 constitute a transformer. Therefore, the secondary coil 112 connected to the second integrated circuit 120 supplies a signal depending on the signal of the primary coil 111 to the second integrated circuit 120.

The second integrated circuit 120 includes the receiver circuit 125 and the gate driver circuit 126. Here, the receiver circuit 125 of the second integrated circuit 120 handles a differential signal received from the secondary coil 112 by using a differential circuit. In the manner, in the receiver circuit 125, resistance against in-phase noise can be improved. Here, in order to match the reference potentials of the transformer and the receiver circuit 125, the midpoint P10 and the second signal line 122 are connected by wire bonding via the second wire 102. The gate driver circuit 126 is connected to an IGBT 902 provided outside the semiconductor device 100, and outputs a drive signal to the IGBT 902.

As shown in FIG. 2, in an environment where the semiconductor device 100 is used, the detector circuit 130 is not connected to the inspection system 20. In other words, the detector circuit 130 is configured not to affect the function of the semiconductor device 100 in an environment where the semiconductor device 100 exerts its function.

Note that each of the external terminals connected to the detector circuit 130 shown in FIG. 2 may be used for a circuit (not illustrated) having another function of the semiconductor device 100. In this case, the detector circuit 130 may be disconnected from the above-described external terminal by a switch or the like. More specifically, the semiconductor device 100 may be configured so that a test mode for inspecting the connection state by using the detector circuit 130 and a use mode for exerting the ordinary function can be switched in accordance with an external signal.

As described above, the first integrated circuit 110 includes a transmitter circuit 113 that transmits a transmission signal for transmitting a predetermined signal. The second integrated circuit 120 is a gate driver that outputs a predetermined drive signal on the basis of the differential signal received from the transmitter circuit 113 via the transformer.

Note that the semiconductor device 100 is not limited to the gate driver. The semiconductor device 100 needs only to include the transformer, and have the package in which the plurality of integrated circuits are connected by wire bonding. For example, the semiconductor device 100 may be an amplifier IC, a DC/DC converter, or the like including the transformer. In the above description, configurations, etc. not mentioned in the description are appropriately omitted in order to facilitate understanding. However, the present disclosure may include other configurations for implementing the above-described functions.

As described above, the present embodiment can provide the disconnection detector circuit that can favorably inspect the connection state of the wire without the increase in the parasitic capacitance.

Second Embodiment

Figure 3:
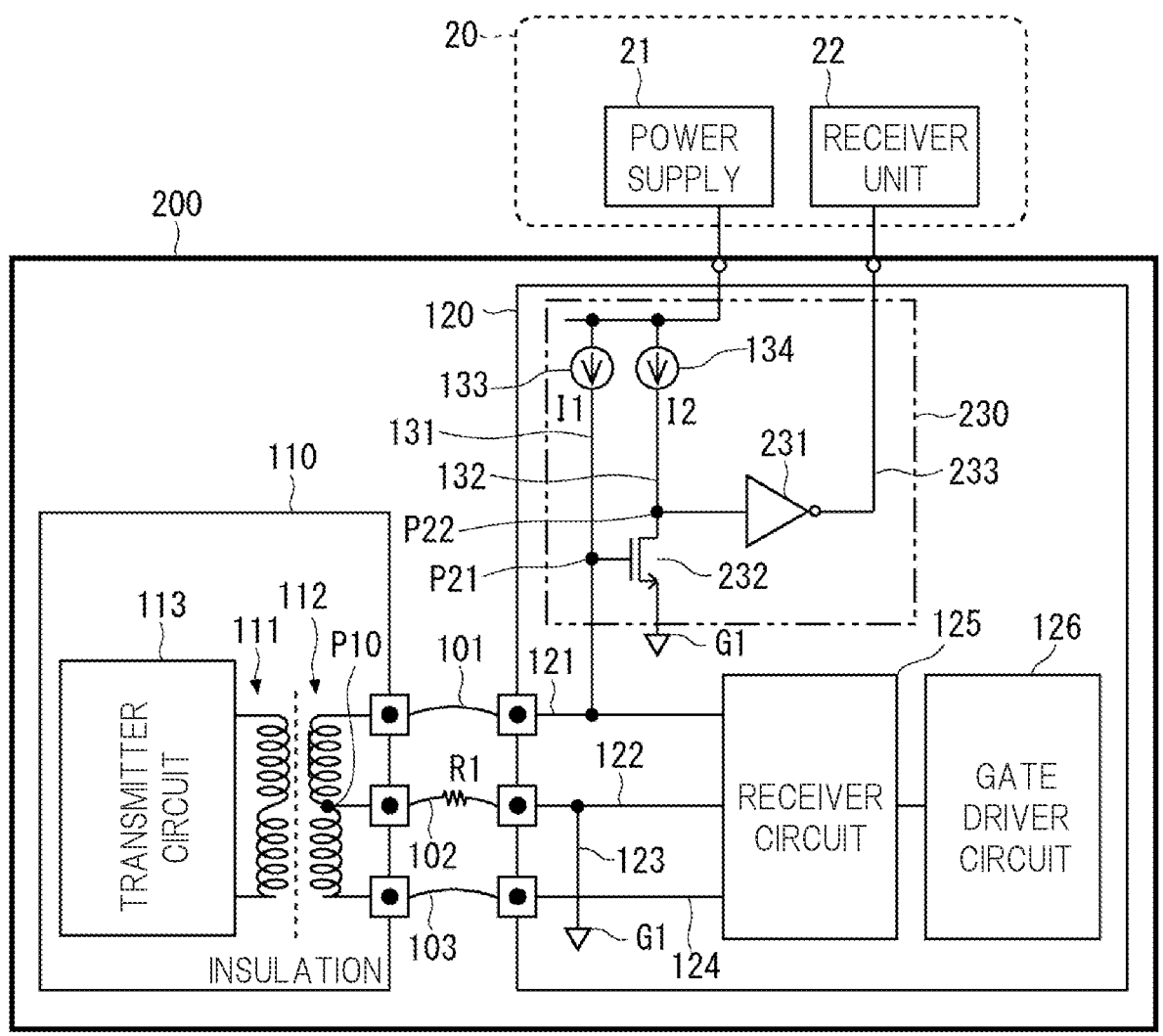
FIG. 3 is a diagram showing a configuration of a semiconductor device according to a second embodiment.

Next, a second embodiment will be described. The second embodiment is different from the first embodiment in that a detector circuit 230 including an inverter is provided instead of the comparator. FIG. 3 is a diagram showing a configuration of a semiconductor device 200 according to the second embodiment.

The second integrated circuit 120 according to the present embodiment includes the detector circuit 230. The detector circuit 230 includes, as a main configuration, a first power supply line 131, a second power supply line 132, an inverter 231, a transistor 232, and an output line 233.

The first power supply line 131 according to the present embodiment receives supply of a preset current from the first constant current supply 133, and supplies this current to the first wire 101 via the contact A1 and the first signal line 121. The first power supply line 131 has a reference point P21. A branch line extends from the reference point P21, and this branch line is connected to the gate of the transistor 232.

The second power supply line 132 receives, at its one end, supply of a preset current from the second constant current supply 134, and is connected to the reference potential unit G1 via the transistor 232. As described in the first embodiment, the second power supply line 132 may be at the reference potential when being connected to the second signal line 122. The same applies to the configurations in the following embodiments.

The source of the transistor 232 is connected to a side of the second power supply line 132 closer to the reference potential unit. The drain of the transistor 232 is connected to a side of the second power supply line 132 closer to the second constant current supply 134. The second power supply line 132 has a reference point P22 between the second constant current supply 134 and the transistor 232. A branch line extends from the reference point P22, and this branch line is connected to the input side of the inverter 231.

The inverter 231 is provided to be capable of detecting a voltage change of the reference point P22 which is a predetermined position in the second power supply line 222. The inverter 231 transmits an output signal to the receiver unit 22 via the output line 233.

The transistor 232 is an NMOS, and the gate of the transistor 232 is connected to the branch line branched from the reference point P21. The drain of the transistor 232 is connected to the reference point P22 side, and the source of the transistor 232 is connected to the reference potential unit G1 side. The transistor 232 is set so that a current flows through the second power supply line 132 when the reference point P21 has a potential higher than the threshold potential.

In the above-described configuration, when the first constant current supply 133 supplies a constant current I1 to the first power supply line 131, a voltage V21 is generated at the reference point P21. Here, the resistance value of the second wire 102 is denoted by R1, and the voltage V21 is expressed as "R1*I1". When the second wire 102 is not disconnected, the resistance value R1 is a sufficiently low value. In this case, the voltage V21 does not turn the transistor 232 ON.

On the other hand, when the second wire 102 is disconnected, the resistance value R1 is high, and therefore, the gate voltage is accordingly made high, and the transistor 232 is turned ON. Accordingly, the voltage of the reference point P22 becomes at an L level of the inverter 231. Therefore, the inverter 231 outputs an H level signal to the output line 233.

The semiconductor device 200 according to the present embodiment has been described above. The semiconductor device 200 can favorably detect the disconnection while using a configuration with less components. Note that the threshold for causing the detector circuit 230 to detect the disconnection can be adjusted by adjusting the current I1 of the first constant current supply 133. Thus, the present embodiment can provide the disconnection detector circuit that can favorably inspect the connection state of the wire while using the simple configuration.

Third Embodiment

Figure 4:
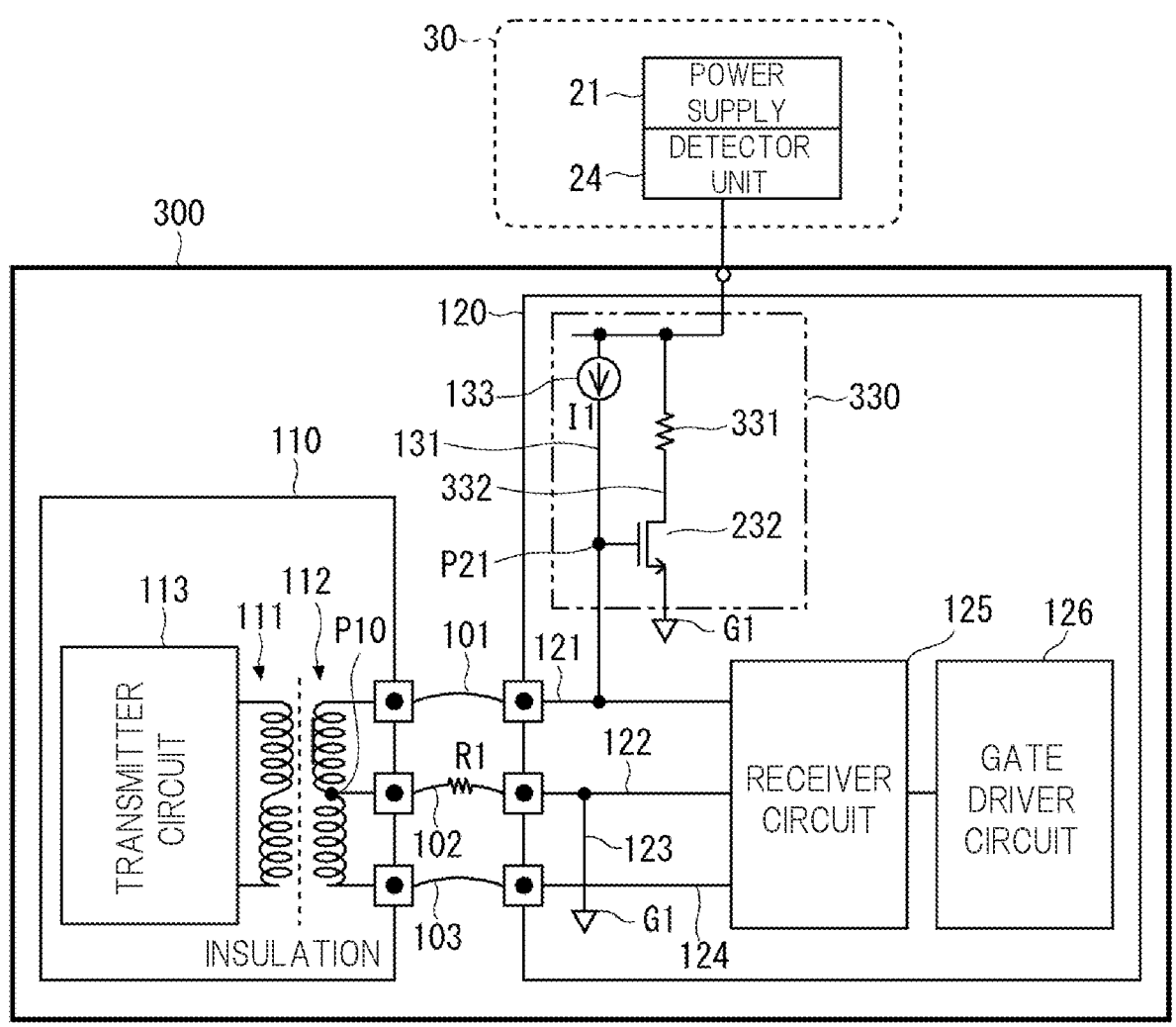
FIG. 4 is a diagram showing a configuration of a semiconductor device according to a third embodiment.

Next, a third embodiment will be described. FIG. 4 is a diagram showing a configuration of a semiconductor device 300 according to the third embodiment. FIG. 4 shows a state where an inspection system 30 and the semiconductor device 300 are connected.

The inspection system 30 according to the present embodiment includes, as a main configuration, an external power supply 21 and a detection unit 24. The external power supply 21 supplies a current to the second integrated circuit 120 of the semiconductor device 300. The detection unit 24 is set to be capable of measuring the current supplied by the external power supply 21 and detect that the connection state of the semiconductor device 300 is normal or abnormal in accordance with the measured current.

The semiconductor device 300 includes a detector circuit 330 instead of the detector circuit 130 or the detector circuit 230 according to the above-described embodiments. The detector circuit 330 includes, as a main configuration, a first power supply line 131, a first constant current supply 133, a second power supply line 332, a resistance 331, and a transistor 232. Note that the configurations of the first power supply line 131, the first constant current supply 133, and the reference point P21 included in the first power supply line 131 according to the present embodiment are similar to those described in the second embodiment.

The second power supply line 322 receives, at its one end, supply of a current derived from the external power supply 21, and is connected to the reference potential unit G1 via the resistance 331 and the transistor 232. The second power supply line 332 includes the resistance 331 on a side closer to the power supply than the transistor 232. The second power supply line 332 includes the transistor 232 between the resistance 331 and the reference potential unit G1.

The transistor 232 is an NMOS, and the gate of the transistor 232 is connected to the branch line branched from the reference point P21. The drain of the transistor 232 is connected to the side connected to the resistance 331, and the source of the transistor 232 is connected to the reference potential unit G1 side. The transistor 232 is set so that flow or non-flow of a current is caused in accordance with the threshold potential at the reference point P21 when its gate is connected to a branch line branched from the reference point P21. The transistor 232 according to the present embodiment is set so that flow of the current is caused through the second power supply line 332 when the reference point P21 has a potential higher than the threshold potential.

In the above-described configuration, when the first constant current supply 133 supplies a constant current I1 to the first power supply line 131, a voltage V21 is generated at the reference point P21. Here, the resistance value of the second wire 102 is denoted by R1, and the voltage V21 is expressed as "R1*I1". When the second wire 102 is not disconnected, the resistance value R1 is a sufficiently low value. In this case, the voltage V21 does not turn the transistor 232 ON.

On the other hand, when the second wire 102 is disconnected, the resistance value R1 is high, and therefore, the gate voltage is made accordingly relatively high. When the potential of the reference point P21 becomes equal to or higher than the threshold, the transistor 232 is turned ON. Accordingly, the current depending on the resistance 331 flows through the second power supply line 332. If the detection unit 24 measures any current flowing through the second power supply line 332, the detection unit 24 detects that the connection state of the semiconductor device 300 is abnormal.

The third embodiment has been described above. In the semiconductor device 300 according to the present embodiment, a change of the power supply current is caused instead of the detector circuit 330 outputting the disconnection detection signal. Therefore, the semiconductor device 300 without a complicated logic circuit for detecting the disconnection according to the present embodiment can detect the disconnection. As described above, the present embodiment can provide the disconnection detector circuit that can favorably inspect the connection state of the wire without the increase in the parasitic capacitance.

Fourth Embodiment

Figure 5:
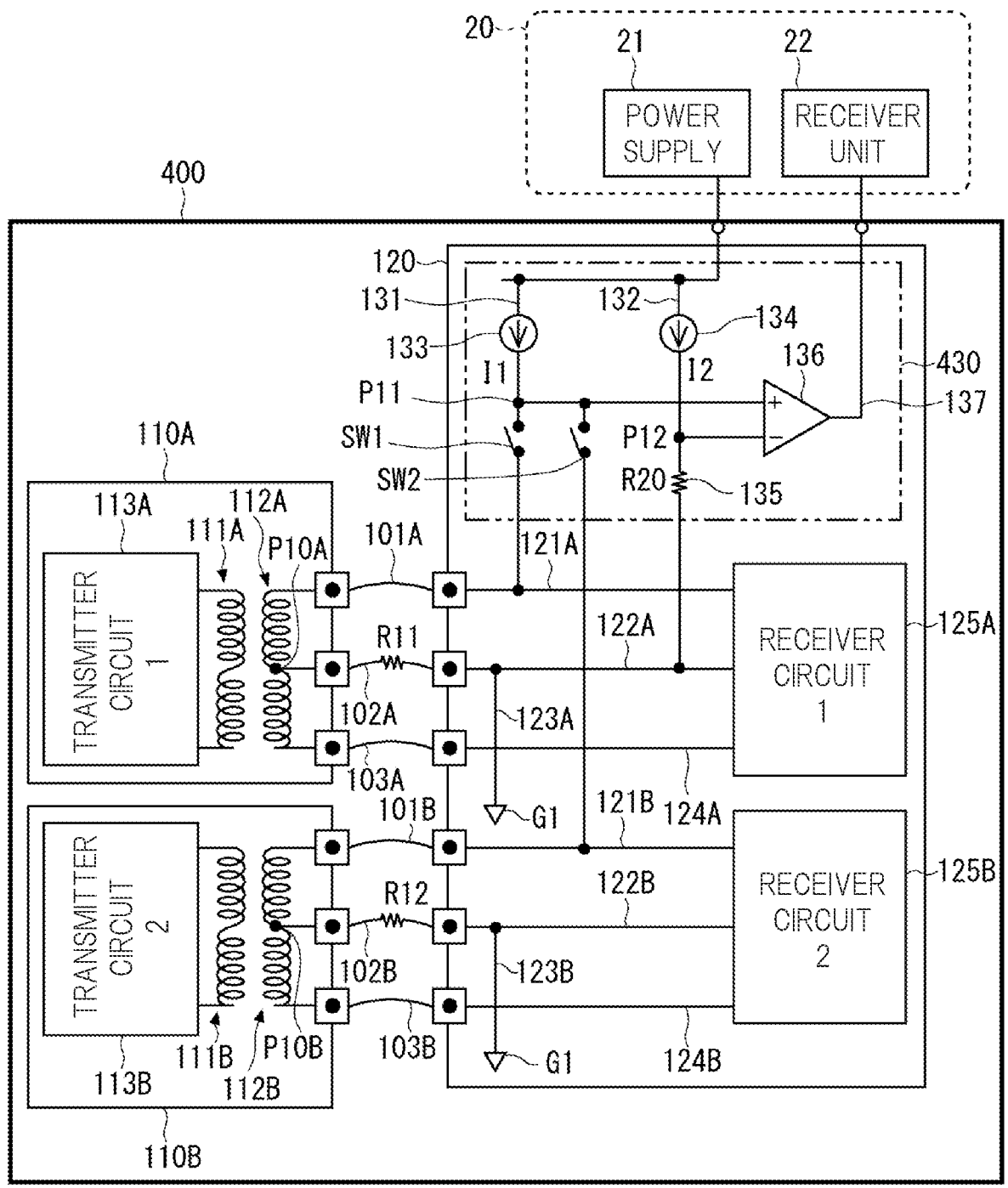
FIG. 5 is a diagram showing a configuration of a semiconductor device according to a fourth embodiment.

Next, a fourth embodiment will be described. FIG. 5 is a diagram showing a configuration of a semiconductor device 400 according to the fourth embodiment. As similar to the first embodiment, the semiconductor device 400 includes a comparator 136 in a detector circuit. However, the semiconductor device 400 is different from the first embodiment in a plurality of transformers and in that that the second integrated circuit 120 includes a switch for independently connecting a constant current supply to each end of the plurality of transformers to be switchable.

The semiconductor device 400 according to the present embodiment is different from the semiconductor device 100 according to the embodiment in that a first integrated circuit 110A and a first integrated circuit 110B are provided. Similarly, the second integrated circuit 120 includes a receiver circuit 125A and a receiver circuit 125B.

The first integrated circuit 110A and the first integrated circuit 110B basically have the same configuration. In FIG. 5, each configuration included in the first integrated circuit 110A is marked with "A" at the end of the reference character. On the other hand, in FIG. 5, each configuration included in the first integrated circuit 110B is marked with "B" at the end of the reference character. Similarly, the wires (the first wires 101, the second wires 102, and the third wires 103) connected to the secondary coil 112A and the secondary coil 112B are marked with a corresponding sign "A" or "B" at the ends of the respective reference characters. Also the first signal line 121 to the third signal line 124 included in the second integrated circuit 120 are marked with a corresponding sign "A" or "B" at the ends of the respective reference characters.

The semiconductor device 400 according to the present embodiment includes a detector circuit 430. The detector circuit 430 includes, as a main configuration, a first power supply line 131, a second power supply line 132, a first constant current supply 133, a second constant current supply 134, a reference resistance 135, a comparator 136, an output line 137, a first switch SW1, and a second switch SW2. Herein, a detailed description of the configuration described in the first embodiment is omitted.

The first power supply line 131 includes a signal line connected from the reference point P11 to the first signal line 121A. Further, the first power supply line 131 includes a signal line branched from the reference point P11 and connected to the first signal line 121B. The first power supply line 131 includes the first switch SW1 between the reference point P11 and the first signal line 121A. Similarly, the first power supply line 131 includes the second switch SW2 on the signal line branched from the reference point P11 and connected to the first signal line 121B. The first power supply line 131 includes also a branch line branched from the reference point P11 and supplying a first input signal to the comparator 136.

In the above-described configuration, the detector circuit 430 performs switching between the first switch SW1 and the second switch SW2 to sequentially supply currents. Note that the switching between the switches can be performed by supplying a control signal (not illustrated) from the inspection system 20.

For example, the detector circuit 430 first inspects the connection state of the second wire 102A. In this case, the first switch SW1 is set to be turned ON, and the second switch SW2 is set to be turned OFF. In the manner, when the first constant current supply 133 supplies the current I1 to the first power supply line 131, the current flows to the secondary coil 112A via the first signal line 121A and the first wire 101A. Further, the current flows to the second wire 102A, the second signal line 122A, and the reference line 123A via the midpoint P10A. Therefore, in this case, the output of the comparator 136 indicates the connection state of the second wire 102A.

Next, the detector circuit 430 inspects the connection state of the second wire 102B. In this case, the first switch SW1 is set to be turned OFF, and the second switch SW2 is set to be turned ON. In the manner, when the first constant current supply 133 supplies the current I1 to the first power supply line 131, the current flows to the secondary coil 112B via the first signal line 121B and the first wire 101B. Further, the current flows to the second wire 102B, the second signal line 122B, and the reference line 123B via the midpoint P10B. Therefore, in this case, the output of the comparator 136 indicates the connection state of the second wire 102B.

As described above, the fourth embodiment has been described. The detector circuit 430 according to the present embodiment detects that the connection state is normal or abnormal for each transformer to be connected. Although the case with two transformers has been described in the present embodiment, the number of the transformers may be three or more. In this case, the detector circuit 430 includes switches corresponding to the number of transformers, and individually inspects the transformers. As described above, the present embodiment can provide the disconnection detector circuit that favorably inspects the connection states of the plurality of wires without the increase in the parasitic capacitance.

The embodiments have been described above. However, the configurations of the above-described embodiments may be combined with each other, or some configurations may be replaced with other configurations. Further, the configurations of the above-described embodiments may be variously modified within the scope of the concept of the invention.

What is claimed is:

1. A semiconductor device comprising, in one package:
a first integrated circuit including a transformer including a primary coil and a secondary coil; and
a second integrated circuit connected to a midpoint and one end of the secondary coil,
wherein the second integrated circuit includes:
a reference line coupled between the midpoint of the secondary coil and a reference potential;
a first power supply line coupled between a first constant current supply and the one end of the secondary coil; and
a detector circuit that detects whether a connection state between the second integrated circuit and the secondary coil is normal or abnormal on basis of a potential at a predetermined reference point of the first power supply line.

2. The semiconductor device according to claim 1, wherein the one end of the secondary coil and the first power supply line are connected via a bonding wire, and the midpoint and the reference line are connected via a bonding wire.

3. The semiconductor device according to claim 1, further comprising
a second power supply line connecting a second constant current supply and the midpoint of the secondary coil,
wherein the detector circuit detects that the connection state is normal or abnormal on basis of a potential difference between the potential at the predetermined reference point and a potential at a predetermined reference point in the second power supply line.

4. The semiconductor device according to claim 3, wherein the detector circuit includes
a comparator receiving inputs from a branch of the first power supply line and a branch of the second power supply line, and includes a signal line for outputting an output signal of the comparator to outside.

5. The semiconductor device according to claim 1, wherein the detector circuit further includes:
a second power supply line connected to a power supply and a ground via a transistor; and
an inverter provided to be capable of detecting a voltage change of a predetermined position in the second power supply line, and
wherein a gate of the transistor is connected to the predetermined reference point, the transistor being set so as to make flow or non-flow of a current on basis of a potential at the predetermined reference point.

6. The semiconductor device according to claim 5, wherein the transistor is an NMOS transistor set so as to make flow of a current through the second power supply line when the potential at the predetermined reference point is higher than a threshold potential of the NMOS transistor, and
wherein the inverter includes a signal line for outputting an output signal to outside.

7. The semiconductor device according to claim 1, wherein the detector circuit further includes
a second power supply line connected to an external power supply and a ground via a transistor, and
wherein a gate of the transistor is connected to the predetermined reference point, the transistor being set so as to make flow or non-flow of a current on basis of a potential at the predetermined reference point.

8. The semiconductor device according to claim 7, wherein the transistor is an NMOS transistor set so as to make flow of a current through the second power supply line when the potential at the predetermined reference point is higher than a threshold potential of the NMOS transistor.

9. The semiconductor device according to claim 1, wherein the semiconductor device includes a plurality of the transformers,
the second integrated circuit includes a switch to connect the first constant current supply to an end of one of the plurality of transformers, and
the detector circuit detects that the connection state is normal or abnormal for the transformer connected by the switch.

10. The semiconductor device according to claim 1, wherein the first integrated circuit includes a transmitter circuit transmitting a transmission signal for transmitting a predetermined signal, and
wherein the second integrated circuit is a gate driver outputting a predetermined drive signal on basis of a differential signal received from the transmitter circuit via the transformer.

* * * * *